(12) United States Patent
Tanaka

(10) Patent No.: US 9,209,315 B2
(45) Date of Patent: Dec. 8, 2015

(54) NONVOLATILE SEMICONDUCTOR MEMORY DEVICE AND PRODUCTION METHOD FOR THE SAME

(71) Applicant: Kabushiki Kaisha Toshiba, Minato-ku (JP)

(72) Inventor: Masayuki Tanaka, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/526,593

(22) Filed: Oct. 29, 2014

(65) Prior Publication Data

US 2015/0048436 A1     Feb. 19, 2015

Related U.S. Application Data

(62) Division of application No. 13/353,512, filed on Jan. 19, 2012, now Pat. No. 8,884,354.

(30) Foreign Application Priority Data

Jan. 28, 2011   (JP) .................................. 2011-016443

(51) Int. Cl.
*H01L 29/788* (2006.01)
*H01L 29/423* (2006.01)
*H01L 29/51* (2006.01)
*H01L 27/115* (2006.01)

(52) U.S. Cl.
CPC ........ *H01L 29/788* (2013.01); *H01L 27/11517* (2013.01); *H01L 29/42336* (2013.01); *H01L 29/511* (2013.01); *H01L 29/513* (2013.01); *H01L 29/517* (2013.01); *H01L 29/7881* (2013.01)

(58) Field of Classification Search
None
See application file for complete search history.

(56) References Cited

U.S. PATENT DOCUMENTS

| | | |
|---|---|---|
| 2005/0002231 A1 | 1/2005 | Ozawa et al. |
| 2005/0003619 A1 | 1/2005 | Tanaka et al. |
| 2007/0196985 A1 | 8/2007 | Ozawa et al. |
| 2008/0067576 A1 | 3/2008 | Yaegashi |
| 2009/0194805 A1 | 8/2009 | Kang et al. |
| 2010/0127320 A1 | 5/2010 | Nishihara et al. |
| 2011/0001180 A1 | 1/2011 | Masuda et al. |

FOREIGN PATENT DOCUMENTS

| | | |
|---|---|---|
| JP | 2007-250565 | 9/2007 |
| JP | 2010-123890 | 6/2010 |
| JP | 2011-14838 | 1/2011 |

OTHER PUBLICATIONS

Office Action mailed Mar. 4, 2014 in Japanese Application No. 2011-016443 filed Jan. 28, 2011 (w/English translation).

*Primary Examiner* — Sonya D McCall Shepard
(74) *Attorney, Agent, or Firm* — Oblon, McClelland, Maier & Neustadt, L.L.P.

(57) ABSTRACT

According to one embodiment, a nonvolatile semiconductor memory device includes a semiconductor substrate; an element isolation insulating film buried in the semiconductor substrate so as to isolate adjacent element; a memory cell having a first insulating film and a charge accumulation film; a second insulating film formed on the charge accumulation films of the memory cells and the element isolation insulating film; and a control electrode film formed on the second insulating film. An upper surface of the element isolation insulating film is lower than an upper surface of the charge accumulation film, the second insulating film is provided with a cell upper portion on the charge accumulation film and an inter-cell portion on the element isolation insulating film, and a dielectric constant of the cell upper portion is lower than a dielectric constant of the inter-cell portion.

6 Claims, 17 Drawing Sheets

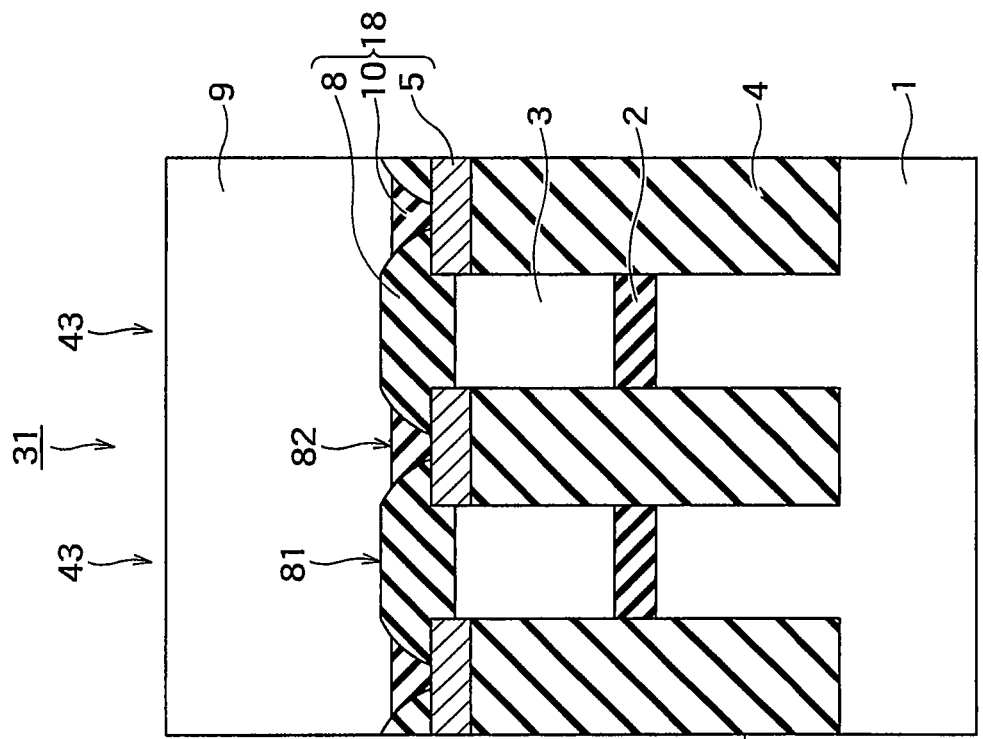
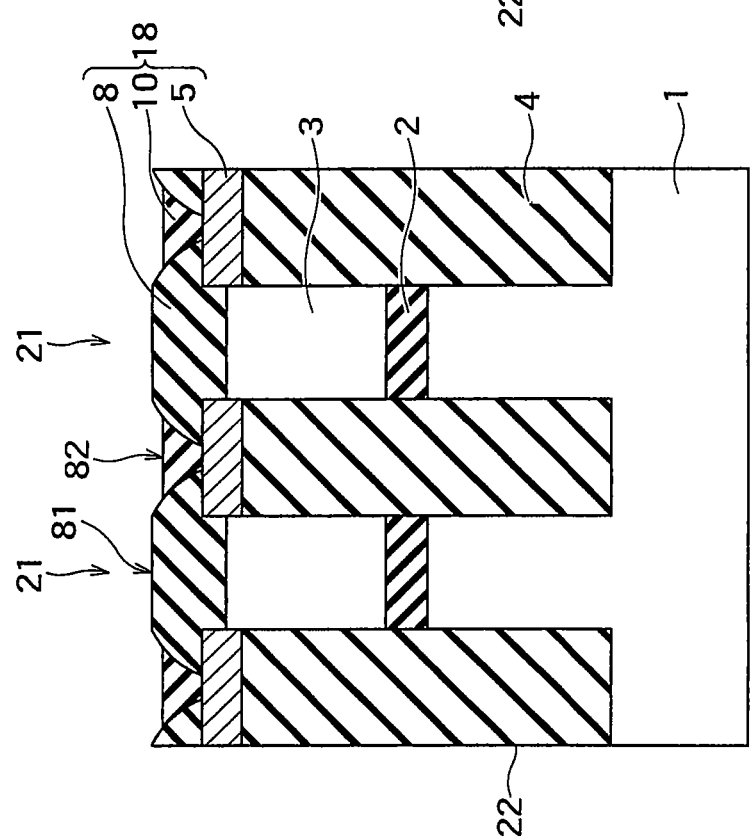

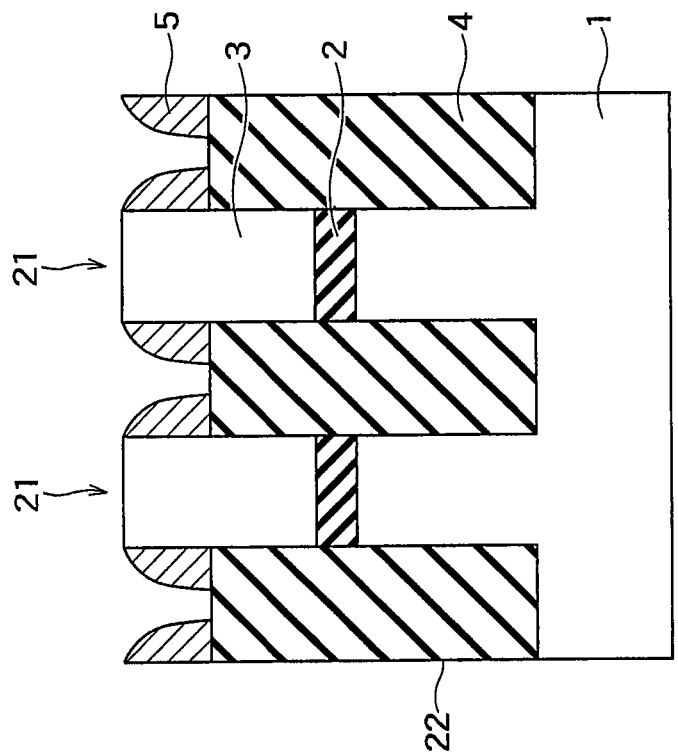
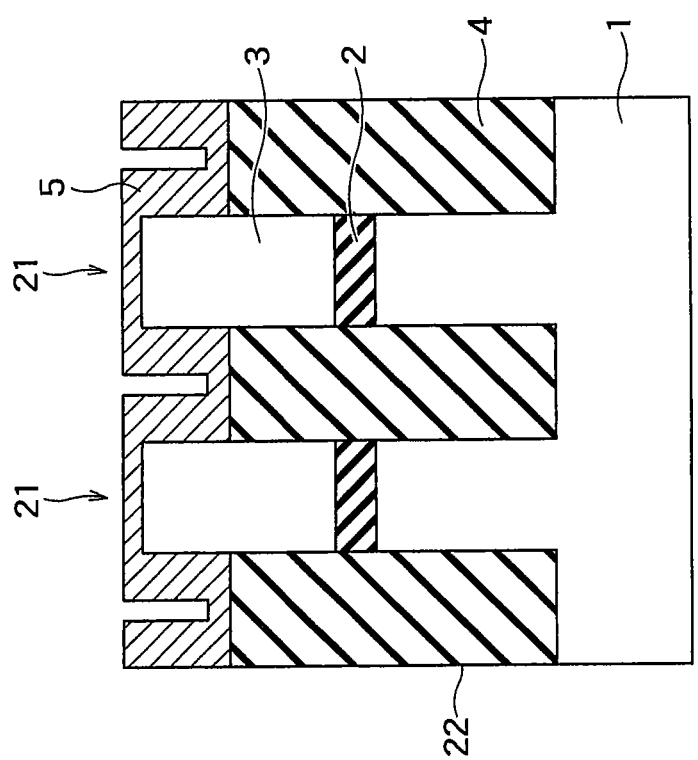

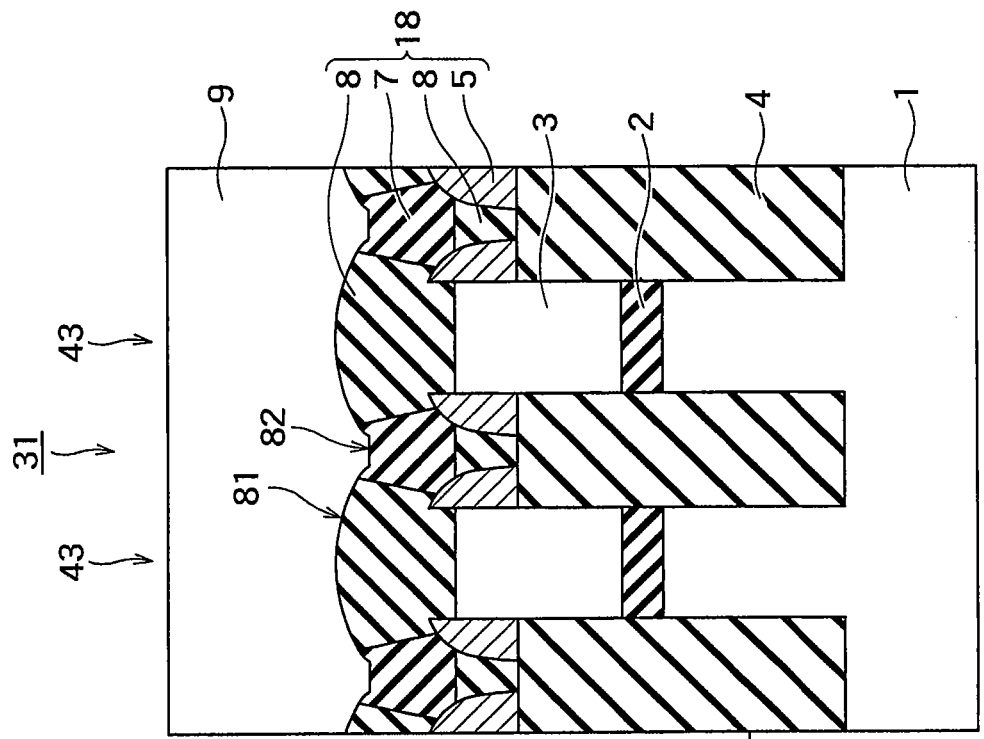
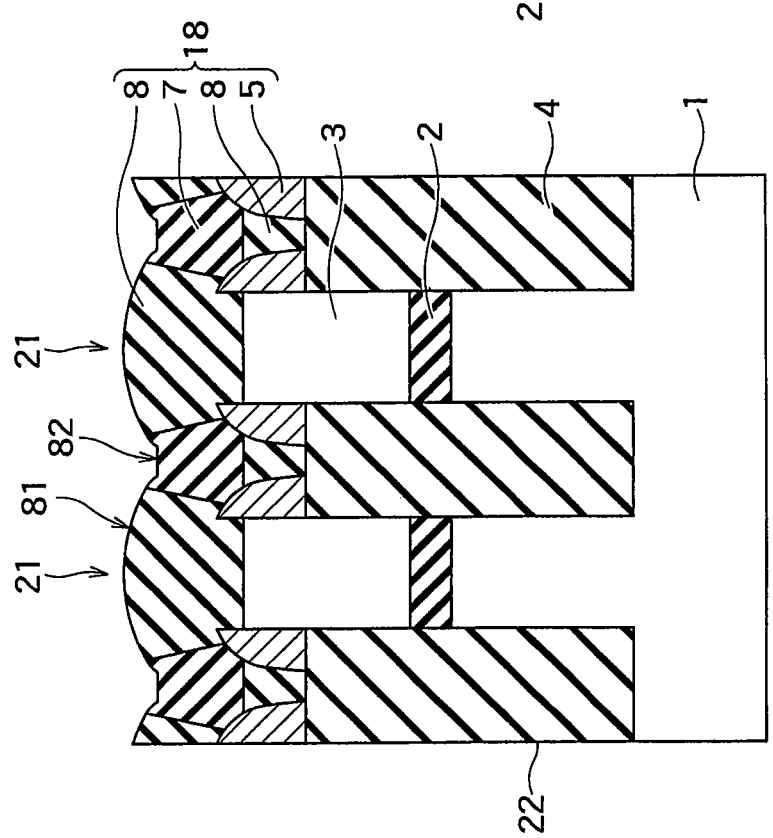

NONVOLATILE SEMICONDUCTOR MEMORY DEVICE AND PRODUCTION METHOD FOR THE SAME

CROSS REFERENCE TO RELATED APPLICATIONS

This application is a division of and claims the benefit of priority under 35 C.F.R. §120 from U.S. Ser. No. 13/353,512 filed Jan. 19, 2012, and claims the benefit of priority under C.F.R. §119 from Japanese Patent Application No. 2011-16443 filed Jan. 28, 2011, the entire contents of each of which are incorporated herein by reference.

FIELD

Embodiments of the present invention relate to nonvolatile semiconductor memory devices and methods for producing the nonvolatile semiconductor memory devices.

BACKGROUND

In a floating gate (FG) type nonvolatile memory, a desired device has been realized by using a three-dimensional cell structure.

More specifically, in order to enable a device operation of the FG type nonvolatile memory, it is necessary to set capacitance values of two types of insulating films to substantially identical values, the two types of insulating films are a tunnel insulating film and an IPD (Inter-Poly Dielectric) insulating film, which insulate a FG serving as a charge accumulation film. In addition, it is necessary to maintain a difference between an electric field to be applied to the tunnel insulating film and an electric field to be applied to the IPD insulating film. The former is required for realizing a write/erase property of the memory, and the latter is required for accumulating the charge in the FG by utilizing a difference in leakage current amount which is caused by the electric field difference (the leakage current amount is larger in the tunnel insulating film, and the leakage current amount is smaller in the IPD insulating film).

Accordingly, in the IPD insulating film, an electrical thickness increase of the IPD insulating film has been realized by using both of an IPD insulating film portion covering an upper surface of the FG and an IPD insulating film portion covering a lateral wall portion of the FG as the capacitor, in other words, by increasing an area by forming the three-dimensional cell structure of the IPD insulating film. Owing to the electrical thickness increase of the IPD insulating film, the electric field applied to the IPD insulating film becomes smaller than the electric field applied to the tunnel insulating film to generate the difference between the leakage current amount of the IPD insulating film and the leakage current amount of the tunnel insulating film in a write/erase operation in the memory, and the difference enables to accumulate or discharge electrons in or from the FG.

In the case where a distance between adjacent memory cells is reduced to 20 nm or less due to the progresses in high integration and microfabrication of memory cells, it is difficult to form the IPD insulating film in such a manner as to cover the top and lateral surfaces of the FG as in the above-mentioned three-dimensional cell structure. In other words, though it is necessary to embed the IPD insulating film and a control electrode film between the adjacent memory cells, it is becoming more and more difficult to embed the control electrode film since a space for embedding the control electrode film is scarcely left between the memory cells after the formation of the IPD insulating film.

Accordingly, a flat cell structure in which the IPD insulating film is flatly formed has been proposed in place of forming the IPD insulating film which covers the lateral wall of the FG as in the three-dimensional cell structure. In this case, since it is difficult to attain the capacitance value increase by using the IPD insulating film portion covering the lateral wall of the FG in the three-dimensional cell structure, it is necessary to ensure the necessary capacitance value of the IPD insulating film only by electrically thinning the IPD insulating film itself. Further, since an insulation property required for the IPD insulating film, i.e. an allowable leakage current amount for memory operation, is uniquely decided depending on the correlation with the tunnel insulating film as a matter of course, it is necessary to satisfy the conventional spec. That is, it is necessary to realize a leakage current amount which is similar to the conventional leakage current amount under the circumstances that the electric field for the IPD insulating film is increased due to the film thinning.

Therefore, in the flat cell structure, the IPD insulating film is formed by using a high-k insulating film which is a material having a higher dielectric constant. Since the high-k insulating film has a high dielectric constant and can be increased in physical film thickness, leak suppression in the film thinning is enabled.

BRIEF DESCRIPTION OF THE DRAWINGS

FIG. 3A to FIG. 3H are sectional views for illustrating a production process of the semiconductor memory device according to the first embodiment;

FIG. 5A to FIG. 5I are sectional views for illustrating a production process of the semiconductor memory device according to the second embodiment;

FIG. 7A to FIG. 7H are sectional views for illustrating a production process of the semiconductor memory device according to the third embodiment.

DETAILED DESCRIPTION

According to one embodiment, a nonvolatile semiconductor memory device is provided with a semiconductor substrate, an element isolation insulating film buried in the semiconductor substrate so as to isolate adjacent element; a memory cell having a layered structure in which a first insulating film and a charge accumulation film are sequentially layered on the semiconductor substrate; a second insulating film formed on the charge accumulation films and the element isolation insulating film; and a control electrode film formed on the second insulating film. In the nonvolatile semiconductor memory device, an upper surface of the element isolation insulating film is lower than an upper surface of the charge accumulation film; and the second insulating film is provided with a cell upper portion on the charge accumulation film and an inter-cell portion on the element isolation insulating film, in which a dielectric constant of the cell upper portion is lower than a dielectric constant of the inter-cell portion.

First Embodiment

Figure 1:
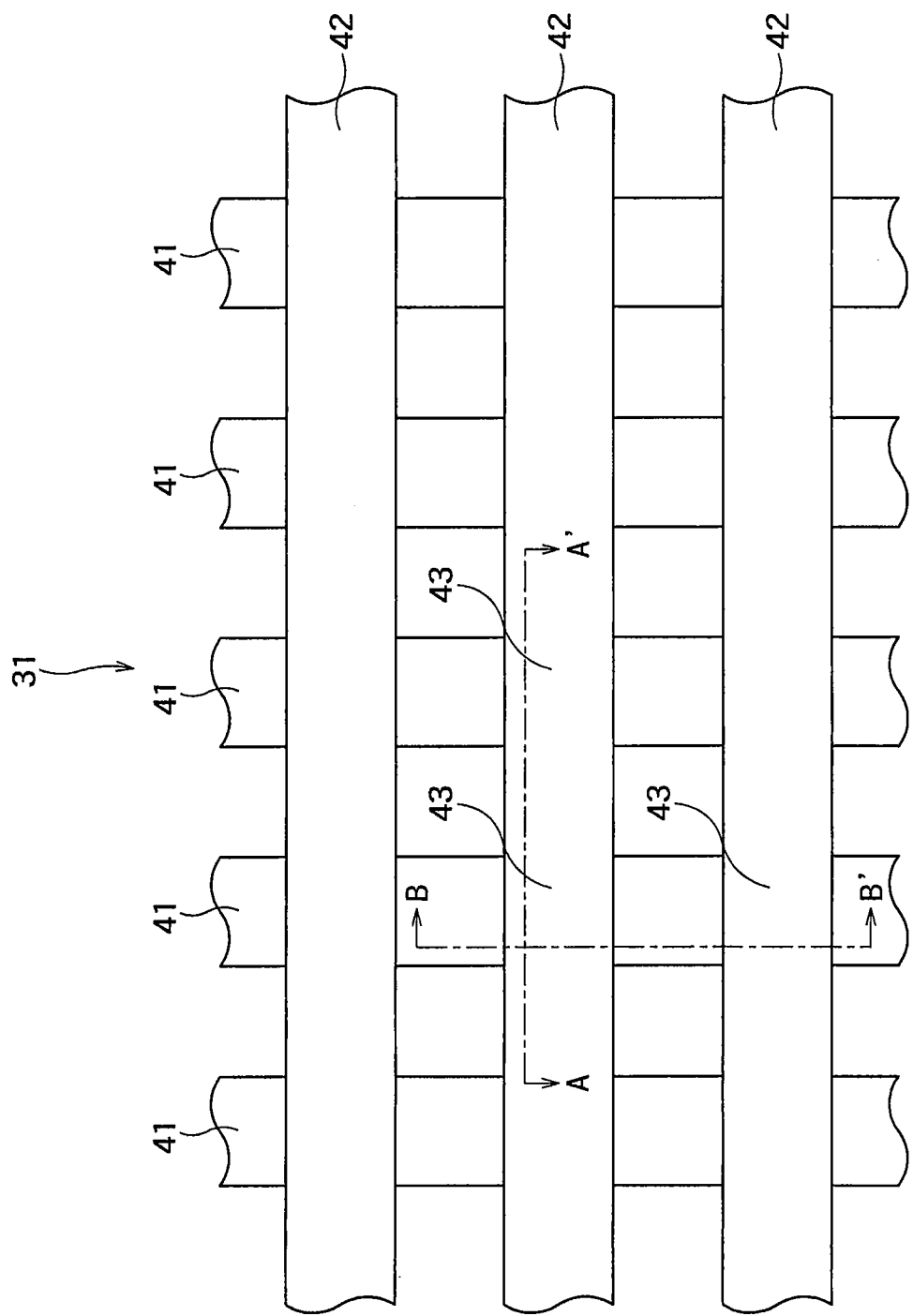
FIG. 1 is a plan view schematically showing a semiconductor memory device according to first to third embodiments.
Figure 2:
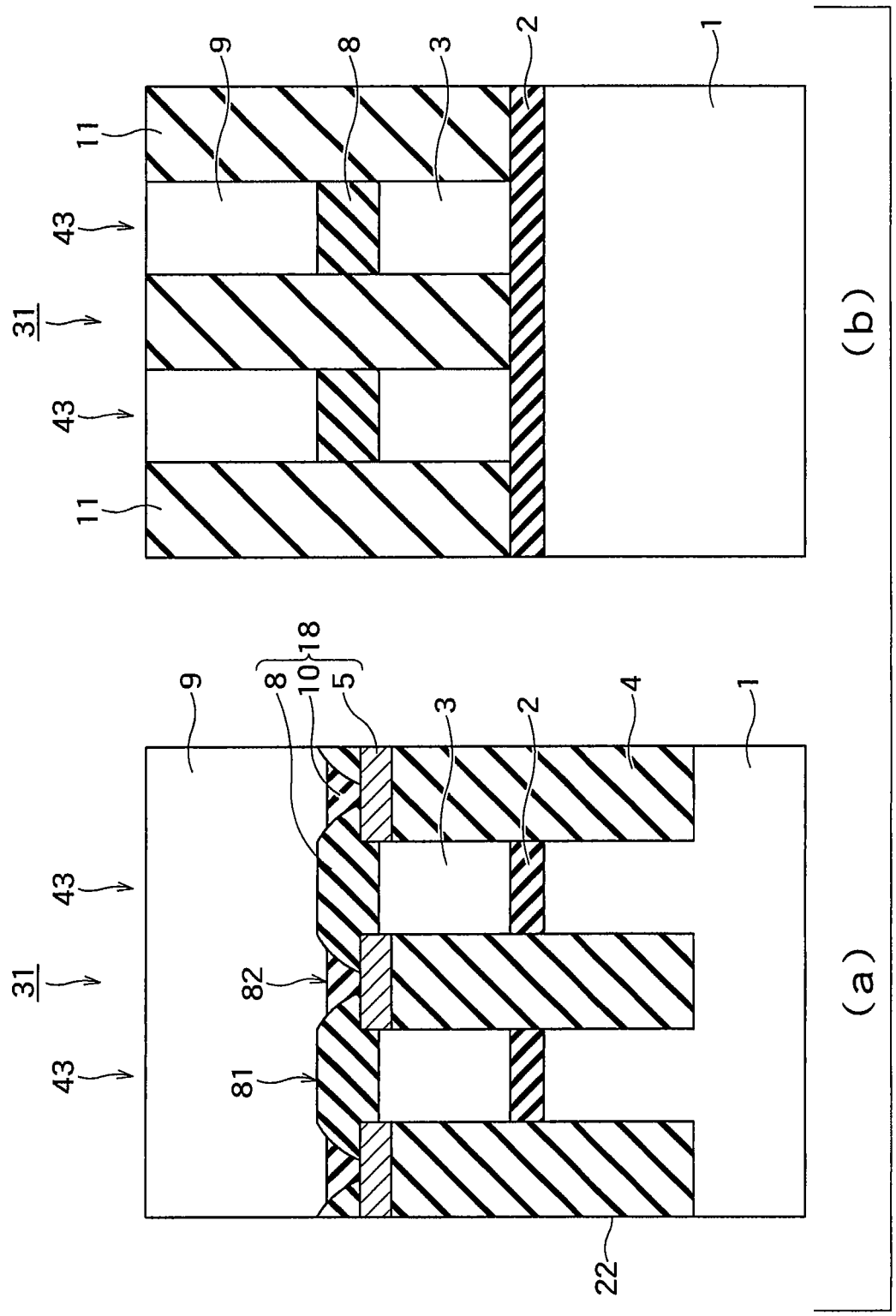
FIG. 2 is a sectional view schematically showing the semiconductor memory device according to the first embodiment.

The present embodiment will be described with reference to FIG. 1 and FIG. 2 showing a semiconductor memory device 31 according to the first embodiment. The FG type semiconductor memory device (nonvolatile semiconductor memory device) 31 having a flat cell structure is taken as an example in the following description, but the present invention is not limited to the semiconductor device and is useful for semiconductor devices of other types.

FIG. 1 is a plan view showing a memory cell region of the semiconductor memory device 31 according to the first embodiment. A plan view of a memory cell region of a semiconductor memory device 31 according to each of a second embodiment and a third embodiment described later in this specification is the same as that shown in FIG. 1.

As shown in FIG. 1, a plurality of bit lines 41 are formed along a vertical direction of the drawing sheet in the semiconductor memory device 31 according to the first embodiment. The plurality of bit lines 41 are disposed with a constant interval being provided in a horizontal direction of the drawing sheet and are parallel to one another. A plurality of word lines (control electrode film) 42 are formed orthogonal to the plurality of bit lines 41 in the plan view. A plurality of memory cells 43 are formed at the plurality of portions where the bit lines 41 and the word lines 42 are three-dimensionally intersect with each other. In other words, the plurality of memory cells 43 are disposed in the form of a matrix in the memory cell region of the semiconductor memory device 31.

The semiconductor memory device 31 according to the first embodiment will be described by using FIG. 2(a) which is a sectional view taken along a line A-A' of FIG. 1 and FIG. 2(b) which is a sectional view taken along a line B-B' of FIG. 1.

As shown in FIG. 2(a), the semiconductor memory device 31 of the present embodiment has a semiconductor substrate 1 and the plurality of memory cells 43 formed on the semiconductor substrate 1. The memory cells 43 are separated from each other for a predetermined distance by an element isolation trench 22, and a silicon oxide film (an element isolation insulating film) 4 is embedded in the element isolation trench 22. The semiconductor memory device 31 has an IPD insulating film (second insulating film) 18 formed on the plurality of memory cells 43 and the silicon oxide film 4, and a control electrode film 9 formed on the IPD insulating film 18. Each of the memory cells 43 has a layer structure in which a tunnel insulating film (first insulating film) 2 and a FG (charge accumulation film) 3 are sequentially formed on the semiconductor substrate 1. An upper surface of the silicon oxide film 4 is lower than an upper surface of the FG 3, and the IPD insulating film 18 has a cell upper portion 81 on the FG 3 and an inter-cell portion 82 on the silicon oxide film 4, in which a dielectric constant of the cell upper portion 81 is lower than a dielectric constant of the inter-cell portion 82. More specifically, the inter-cell portion 82 has a layer structure of a lower insulating film 5 formed on the silicon oxide film 4, an upper insulating film 10 formed on the lower insulating film 5, and a lanthanum-containing insulating film 8. The lower insulating film 5 is formed from an alumina film; the upper insulating film 10 is formed from a lanthanum aluminate film; and the lanthanum-containing insulating film 8 is formed of a lanthanum alumisilicate film. Further, the cell upper portion 81 is formed from the lanthanum-containing insulating film 8, more specifically from the lanthanum alumisilicate film. In other words, the lanthanum-containing insulating film 8 forming the cell upper portion 81 is located on the FG3, and is projected to the inter-cell portion 82. The lanthanum-containing insulating film 8 is included in the inter-cell portion 82, and the inter-cell portion 82 has the higher dielectric constant than the cell upper portion 81 which is formed only from the lanthanum-containing insulating film 8. Further, as shown in FIG. 2(a), an entire part of the upper surface of the silicon oxide film 4 may be covered with the lower insulating film 5.

As shown in FIG. 2(b), the semiconductor memory device 31 of the present embodiment has the semiconductor substrate 1 and the plurality of memory cells 43 formed on the semiconductor substrate 1. The memory cells 43 are separated from each other for a predetermined distance by an inter-cell insulating film 11. The semiconductor memory device 31 has the lanthanum-containing insulating film 8 formed on the plurality of memory cells 43 and a control electrode film 9 formed on the lanthanum-containing insulating film 8. Each of the memory cells 43 has a layer structure in which the tunnel insulating film 2 and the FG 3 are sequentially formed on the semiconductor substrate 1.

According to the present embodiment, in the flat cell structure for realizing high integration and microfabrication of memory cells, it is possible to form the high-k insulating film having good film quality with less defect in the cell upper portion without changing a capacitance value of the entire IPD insulating film 18 by forming the high-k insulating film having higher dielectric constant in the inter-cell portion 82 of the IPD insulating film 18 and the high-K insulating film having lower dielectric constant in the cell upper portion 81 of the IPD insulating film 18, thereby enabling to obtain the semiconductor memory device which is excellent in electric property and reliability.

More specifically, in the semiconductor memory device 31 of the flat cell structure, the high-k insulating film is used as the IPD insulating film 18 as described above. It is difficult to realize good film quality with the use of the high-k insulating film. From the qualitative point of view, the higher the dielectric constant of the high-k film is, the more difficult is the realization of good film quality. In other words, it is difficult to attain both of the high dielectric constant and the good film quality in the high-k insulating film. As a reason for the difficulty in attaining the good film quality, it is considered that more oxygen defects tend to be stabilized since a large part of metal elements forming the high-k insulating film is formed of transition metal elements which are bound to oxygen by d-orbitals.

Therefore, even when a high-k insulating film having high dielectric constant is used, there are many defects which cause charge trapping in the film when film quality thereof is poor, and, therefore, an increase in leakage current due to the trapping and deterioration of memory characteristics due to trapping/de-trapping can occur. For example, in a memory (semiconductor memory device), a trapped electron which is trapped by a defect in an IPD insulating film during charge retention (writing) is de-trapped in a horizontal direction to cause a change of a charge retention state of a memory cell which is adjacent to the IPD insulating film, which is problematic. Therefore, it is preferable to use the high-k insulating film having good film quality as the IPD insulating film 18.

Further, the high-k insulating film has a low crystallization temperature and is not heat resistant. In short, morphology deterioration due to crystallization can readily occur in the high-k insulating film. Since oxygen donation-acceptance is easy in the high-k insulating film, the oxygen defect is caused in the film by a heat treatment in a production process. In the case of a ternary metal oxide, phase separation of each of the metal elements into a monoxide can occur due to the heat treatment in the production process.

Further, in order to avoid the characteristics deterioration and the like, addition of an element such as silicon, aluminum, and nitrogen may be considered, but the dielectric constant of the high-k insulating film is lowered depending on an added amount though it is possible to reduce the defects in the film by the added element.

Accordingly, the high-k insulating film having low dielectric constant is formed in the cell upper portion 81 of the IPD insulating film 18 in the present embodiment. Therefore, since it is possible to form the high-k insulating film having good film quality with less defect in the cell upper portion 81 of the IPD insulating film 18, it is possible to avoid the increase in leakage current otherwise caused by charge trapping in the film and the characteristics deterioration of the memory otherwise caused by the trapping/de-trapping and the like. Further, the high-k insulating film having high dielectric constant is formed in the inter-cell portion 82 of the IPD insulating film 18. The cell upper portion 81 and the inter-cell portion 82 of the IPD insulating film 18 contribute to the capacitance value of the IPD insulating film 18, the finer the memory cell becomes, the lager the contribution of the inter-cell portion 82 becomes. Therefore, even when the high-k insulating film having low dielectric constant is formed in the cell upper portion of the IPD insulating film 18 as in the present embodiment, it is possible to avoid a reduction in capacitance value of the entire IPD insulating film 18 since the high-k insulating film having high dielectric constant is formed in the inter-cell portion 82 of the IPD insulating film 18.

According to the inventor, the following estimate was obtained by forming semiconductor memory devices 31 having flat cell structure by using insulating films of various combinations without changing the capacitance value of the IPD insulating film 18. In the case of forming the IPD insulating film 18 of the present embodiment in such a manner that the capacitance value thereof is the same as that of the IPD insulating film 18 in which the IPD insulating film 18 having a uniform dielectric constant of about 16 is formed in the cell upper portion 81 and the inter-cell portion 82, a high-k insulating film having a dielectric constant of about 10 to 13 can be used for the cell upper portion 81 of the IPD insulating film 18. More specifically, in the case of forming a high-k insulating film having a dielectric constant of about 20 as the inter-cell portion 81 of the IPD insulating film 18, the high-k insulating film having the dielectric constant of about 10 to 13 is used for the cell upper portion 81 of the IPD insulating film 18. In the case where the inter-cell portion 82 of the IPD insulating film 18 is formed from a silicon oxide film (dielectric constant: 3.9), a dielectric constant of the cell upper portion 81 of the IPD insulating film 18 is about 26.

In short, according to the present embodiment, since it is possible to form the high-k insulating film having less defect and good film quality in the cell upper portion 81 of the IPD insulating film 18 without changing the capacitance value of the entire IPD insulating film 18, it is possible to obtain the semiconductor memory device 31 which is excellent in electric characteristics and reliability.

Hereinafter, a method for producing the semiconductor memory device 31 according to the first embodiment will be described with reference to FIG. 3A to FIG. 3H. FIG. 3A to FIG. 3H are corresponding to FIG. 2(a) which is a sectional view taken along a line A-A' of FIG. 1.

Figure 3A:
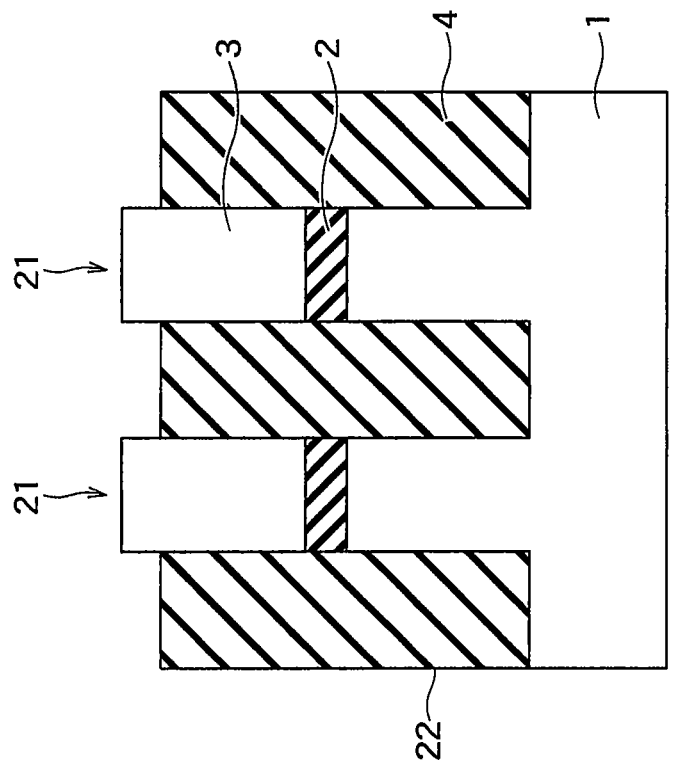

An element region 21 and the element isolation trench 22 are formed on the semiconductor substrate 1 as shown in FIG. 3A. In the element region 21 in which the memory cell 43 is to be formed, the tunnel insulating film (silicon oxide film, for example) 2 is formed on the silicon substrate 1, and the FG (polysilicon film, for example) 3 is formed on the tunnel insulating film 2. The silicon oxide film 4 is embedded in the element isolation trench 22, and upper surfaces of the element region 21 and the silicon oxide film 4 are flattened by chemical mechanical polishing (CMP).

Figure 3B:
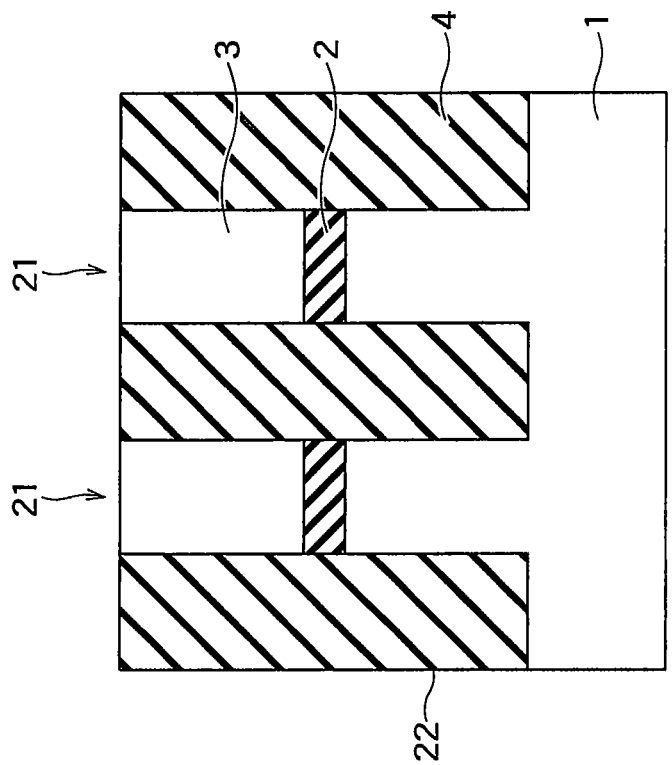

Next, as shown in FIG. 3B, the silicon oxide film 4 is etched back for about 1 to 10 nm, for example, by employing a wet etching method using a chemical liquid having etching selectivity between silicon and a silicon oxide film, a dry etching method, or the like. In the etch-back, the dry etching method which is capable of isotropic etching may preferably be employed.

Figure 3C:
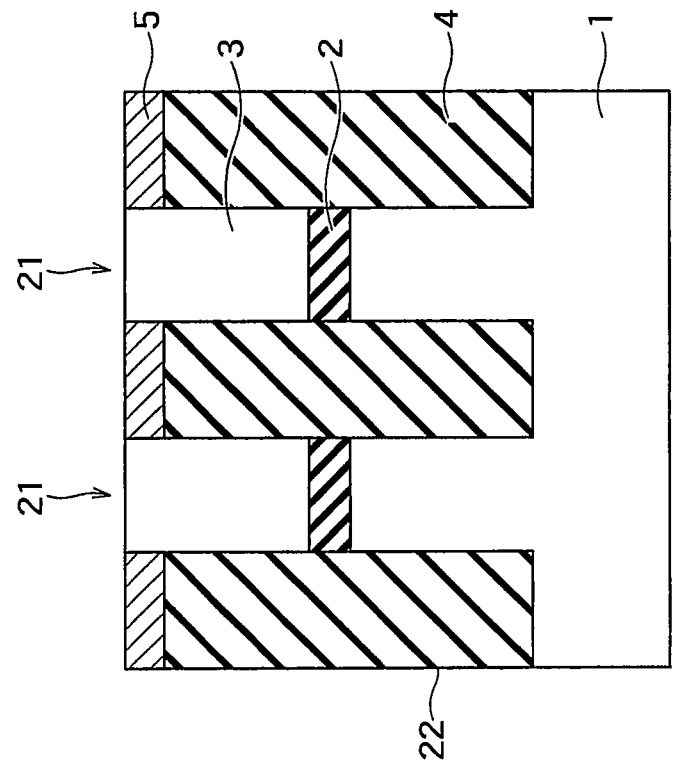

Next, as shown in FIG. 3C, the alumina film 5 having a film thickness of 6 nm, for example, is formed in such a manner as to cover the FG 3 and the silicon oxide film 4. In the present embodiment, the alumina film 5 is formed by atomic layer deposition (ALD). More specifically, ALD was performed by using trimethyl aluminum (TMA) as an aluminum source and ozone as an oxidation agent and at a film formation temperature of 300° C. ALD is employed for forming a film by the unit of atomic layer by repeating a sequence including supply of an active gas such as ozone, purge by evacuation, supply of a metal material gas such as TMA, purge by evacuation, and supply of an active gas such as ozone for a plurality of times. As the method for forming the alumina film 5 in the present embodiment, various methods other than the above-described one may be employed. For example, the source of aluminum may be a material such as other alkyl aluminums in which an alkyl group other than a methyl group is bound to an aluminum element and halogenated aluminum. The oxidation agent may be other materials such as water, oxygen, and oxygen radical. Further, the film formation method is not limited to ALD, and CVD, physical vapor deposition (PVD) utilizing physical excitation, or the like may be employed.

Figure 3D:
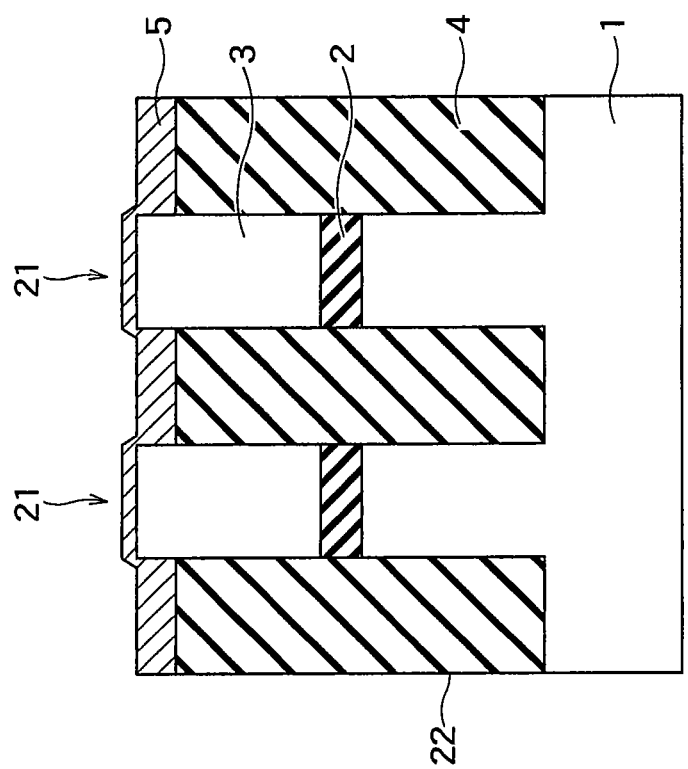

Next, as shown in FIG. 3D, the alumina film 5 is flattened by CMP by using the FG 3 as a stopper. In the present embodiment, since the alumina film 5 is formed at a low temperature by employing ALD, the thus-formed alumina film 5 has a remarkably low density as compared to a single crystal and has an amorphous structure. Therefore, selectivity in the flattening by CMP is readily ensured.

Figure 3F:
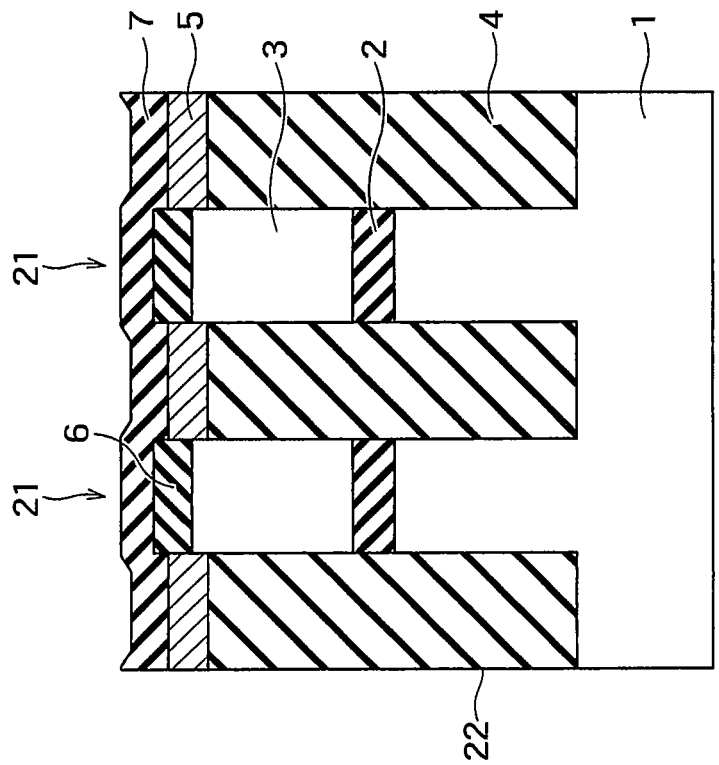
Figure 3E:
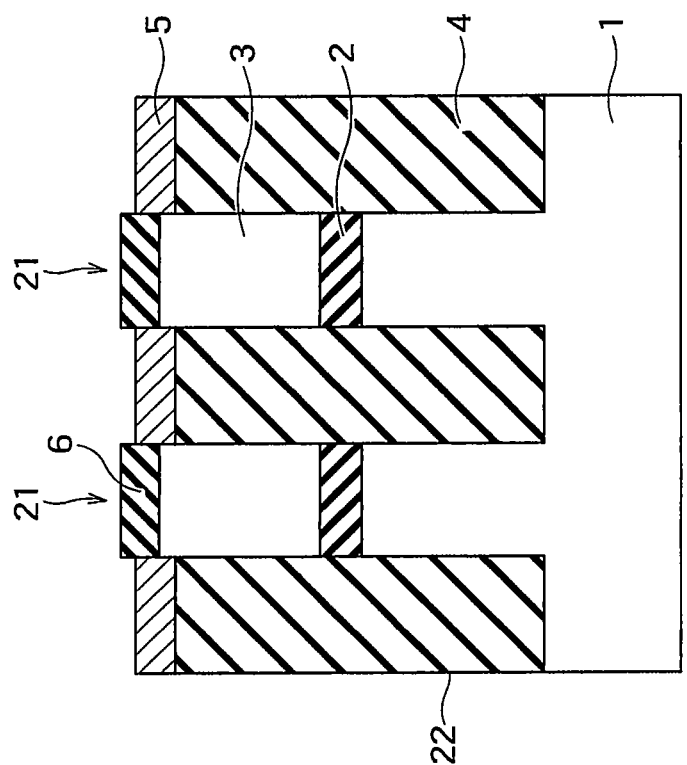

As shown in FIG. 3E, an oxidation treatment is performed on a superficial portion of the FG 3, and a silicon oxide film 6 having a film thickness of 7 nm, for example, is formed on the superficial portion of the FG 3.

Next, as shown in FIG. 3F, a lanthanum aluminate film 7 having a film thickness of 7 nm, for example, is formed on the alumina film 5 and the silicon oxide film 6. As a method for forming the lanthanum aluminate film 7, CVD, in which $La(EtCp)_3$ (tris(ethylcyclopentadienyl)lanthanum) as a lanthanum source gas, trimethyl aluminum as an aluminum source gas, and ozone ($O_3$) are introduced together into a reaction furnace at 200° C. to 700° C., and a pressure is maintained within a range of 0.1 to 5 Torr, may be employed. As the method for forming the lanthanum aluminate film 7, sputtering using an $Al_2O_3$ target and $La_2O_3$ target may also be employed.

Next, the silicon oxide film 6 and the lanthanum aluminate film 7 are subjected to a heat treatment in a furnace at a temperature of 700° C. to 1100° C. under a nitrogen atmosphere to cause a mixing reaction therebetween. Thus, the lanthanum alumisilicate film 8 is formed on the FG 3 as shown in FIG. 3G. Under the above described conditions, the lanthanum aluminate film 7 does not cause a mixing reaction with the alumina film 5. Further, the alumina film 5 does not cause a mixing reaction with the silicon oxide films 4 and 6. Therefore, the mixing reaction occurs on the FG 3 only at the portion where the lanthanum aluminate film 7 and the silicon oxide film 6 are in contact with each other. In the mixing reaction step, it is preferable to perform the heat treatment sufficient enough to prevent the silicon oxide film 6 from remaining on a boundary between the lanthanum aluminate film 7 and the silicon oxide film 6. In the case where a memory (semiconductor memory device) is formed with the residual silicon oxide film 6 being left on the boundary, only a barrier height of the remaining thin silicon oxide film 6 is present for electrons, and a high electric field leakage is increased in the IPD insulating film 18 since a high electric field is applied to the memory cell in an operation of writing to the memory. As a result, a problem that desired write characteristics are not attained in the memory is caused.

Next, as shown in FIG. 3H, the control electrode film 9 is formed on the lanthanum aluminate film 7 and the lanthanum alumisilicate film 8. As described above, it is possible to obtain the semiconductor memory device 31.

Though the alumina film is exemplified as the lower insulating film 5 in the present embodiment, an insulating nitride film such as a silicon nitride film, an aluminum nitride film, and a boron nitride film as well as an oxide film containing a non-transition metal such as a magnesium oxide film may be used as the lower insulating film 5. Further, though the lanthanum alumisilicate film is used as the cell upper portion 81, a yttrium silicate film, a hafnium silicate film, a zirconium silicate film, a yttrium alumisilicate film, a hafnium alumisilicate film, a zirconium alumisilicate film, or a lanthanum hafnium silicate film may be used. In this case, in place of the lanthanum aluminate film 7 which is the material film of the cell upper portion 81, any one of a yttrium oxide film, a hafnium oxide film, a zirconium oxide film, a lanthanum oxide film, a yttrium aluminate film, a hafnium aluminate film, a zirconium aluminate film, a lanthanum hafnium oxide film, a hafnium silicate film, and a lanthanum silicate film is used.

Further, as the combination of the lower insulating film 5 and the cell upper portion 81, a combination of the alumina film and the lanthanum aluminate film is preferred. The alumina film is a stable material having a relatively high dielectric constant and is less subject to oxygen defect which can be a trap. The lanthanum aluminate film is a material having a high dielectric constant and a high barrier height and enables to effectively reduce the high electric field leakage.

Though the material for the lower insulating film 5 and the cell upper portion 81 are described above, materials other than those described above may be used. For example, by forming a film having a lower density than the ordinarily used film or a film having many oxygen defects as a material film for the cell upper portion 81 and forming a film having an ideal stoichiometric composition as the lower insulating film 5, it is possible to cause the mixing reaction only on the FG 3 even when the material film of the lower insulating film 5 is the same as the material film of the cell upper portion 81.

Though good film quality is more easily attained when the dielectric constant of the cell upper portion 81 is suppressed to a lower value, a material having an optimum dielectric constant which enables a desired capacitance value and a desired leakage current of the IPD insulating film 18, i.e. which enables a desired operation of the FG type semiconductor memory device 31, is selected as the material for the IPD insulating film 18.

Second Embodiment

In the present embodiment, a lanthanum alumisilicate film 8 is formed in such a manner that a region in which the lanthanum alumisilicate film 8 formed on a FG 3 is more restricted on the FG 3 as compared to the first embodiment. In other words, by forming the insulating film 8 which forms a cell upper portion 81 and has a low dielectric constant in such a manner as to be more restricted on the FG 3, an area thereof is reduced, thereby enabling a more reduction in dielectric constant of the insulating film 8. Therefore, since it is possible to form an IPD insulating film 18 having higher quality on the FG 3, it is possible to much more improve electric characteristics and reliability of a nonvolatile semiconductor memory device 31.

The semiconductor memory device 31 of the present embodiment will be described. A FG type semiconductor memory device 31 having a flat cell structure will be taken as an example in the following description, but the present invention is not limited to the semiconductor device and is useful for semiconductor devices of other types.

As described in the foregoing, a plan view in a memory cell region of the nonvolatile semiconductor memory device 31 is the same as that shown in FIG. 1. The description of FIG. 1 is not repeated.

By using FIG. 4(a) which is a sectional view taken along the line A-A' of FIG. 1, the semiconductor memory device 31 of the second embodiment will be described. A sectional view of the semiconductor memory device 31 of the present embodiment taken along the line B-B' of FIG. 1 is shown in FIG. 4(b). Since FIG. 4(b) is the same as FIG. 2(b) showing the corresponding sectional view according to the first embodiment, the description for FIG. 4(b) is not given.

Figure 4:
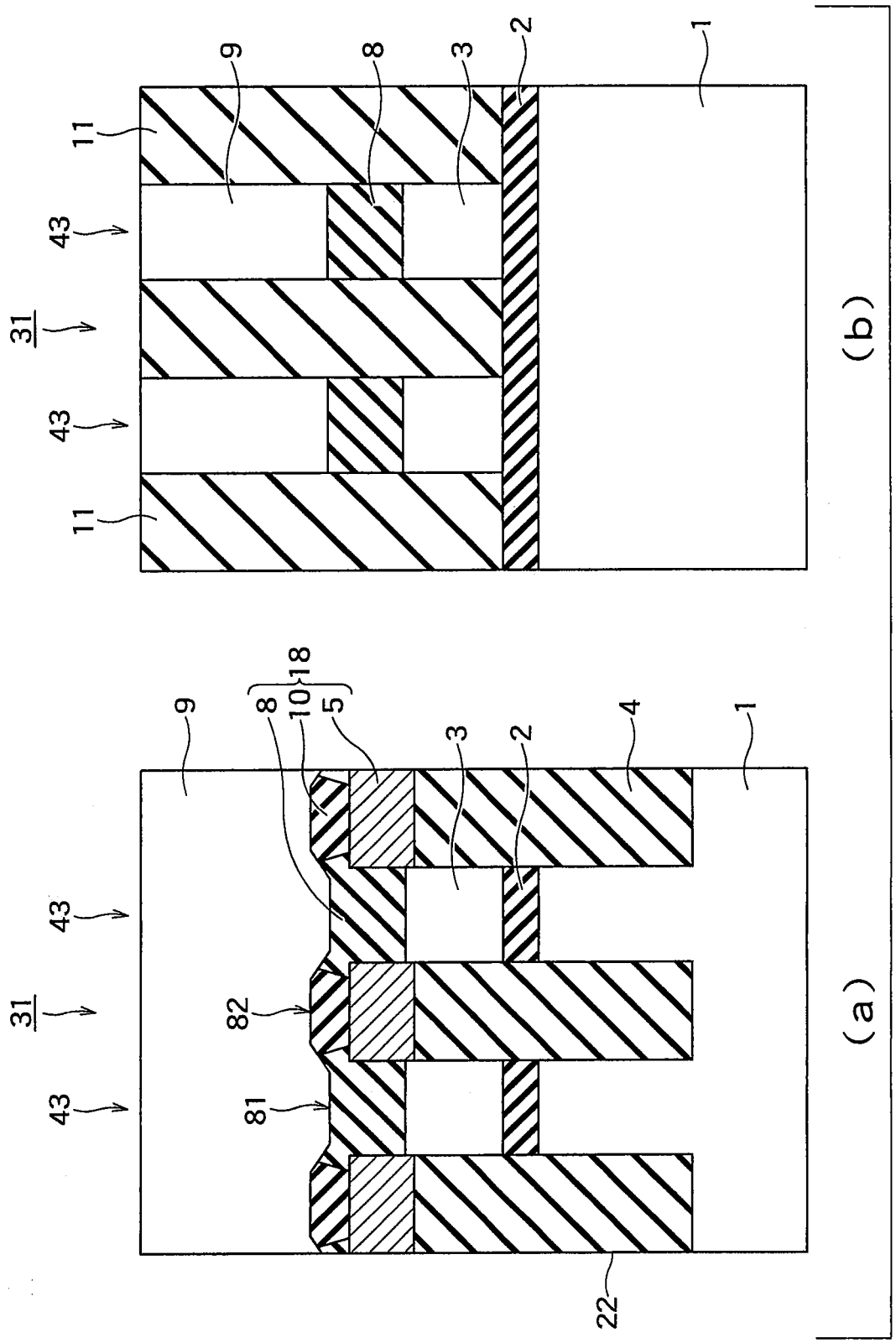
FIG. 4 is a sectional view schematically showing the semiconductor memory device according to the second embodiment.

As shown in FIG. 4(a), the semiconductor memory device 31 of the present embodiment has a semiconductor substrate 1 and a plurality of memory cells 43 formed on the semiconductor substrate 1. The memory cells 43 are separated from each other for a predetermined distance by an element isolation trench 22, and a silicon oxide film 4 is embedded in the element isolation trench 22. The semiconductor memory device 31 has an IPD insulating film 18 formed on the plurality of memory cells 43 and the silicon oxide film 4 and a control electrode film 9 formed on the IPD insulating film 18. Each of the memory cells 43 has a layer structure in which a tunnel insulating film 2 and a FG 3 are sequentially formed on the semiconductor substrate 1. An upper surface of the silicon oxide film 4 is lower than an upper surface of the FG 3, and the IPD insulating film 18 has a cell upper portion 81 on the FG 3 and an inter-cell portion 82 on the silicon oxide film 4, in which a dielectric constant of the cell upper portion 81 is lower than a dielectric constant of the inter-cell portion 82. More specifically, the inter-cell portion 82 has a layer structure of a lower insulating film 5 formed on the silicon oxide film 4 and an upper insulating film 10 formed on the lower insulating film 5. The lower insulating film 5 is formed from an alumina film, and the upper insulating film 10 is formed from a lanthanum aluminate film. The cell upper portion 81 is formed from a lanthanum-containing insulating film 8, more specifically, from a lanthanum alumisilicate film. As compared to the first embodiment (see FIG. 2(a)) in which the lanthanum-containing insulating film 8 forming the cell upper portion 81 is projected to the inter-cell portion 82, projection of the lanthanum-containing insulating film 8 forming the cell upper portion 81 to the inter-cell portion is suppressed (see FIG. 4(a)).

Hereinafter, a method for producing the semiconductor memory device 31 according to the second embodiment will be described with reference to FIG. 5A to FIG. 5I. FIG. 5A to FIG. 5I are corresponding to the sectional view taken along the line A-A' of FIG. 1 and FIG. 4(a).

Figure 5A:
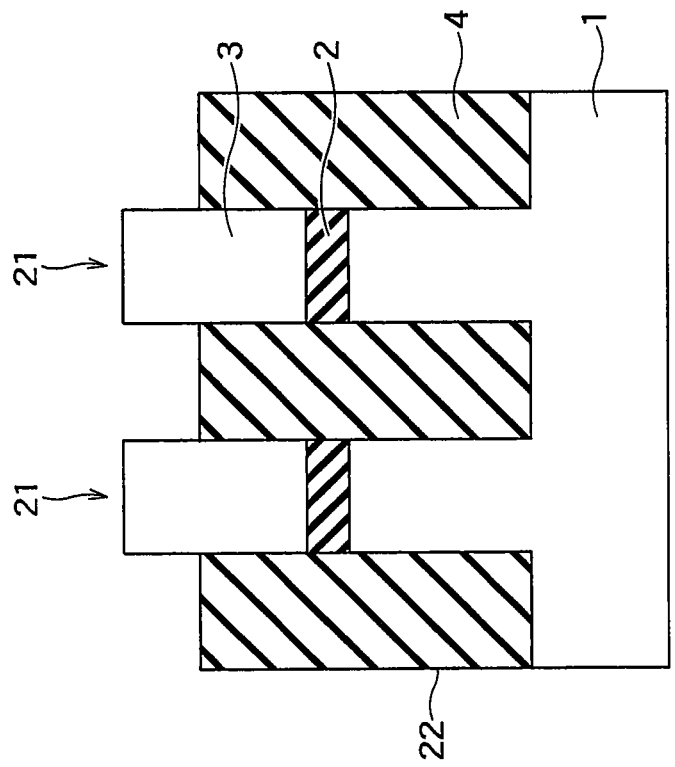

As shown in FIG. 5A, an element region 21 and the element isolation trench are formed on the semiconductor substrate 1 as in the first embodiment. In the element region 21 in which the memory cell 43 is to be formed, the tunnel insulating film 2 is formed on the silicon substrate 1, and the FG 3 is formed on the tunnel insulating film 2. The silicon oxide film 4 is embedded in the element isolation trench 22, and upper surfaces of the element region 21 and the silicon oxide film 4 are flattened by CMP.

Figure 5B:
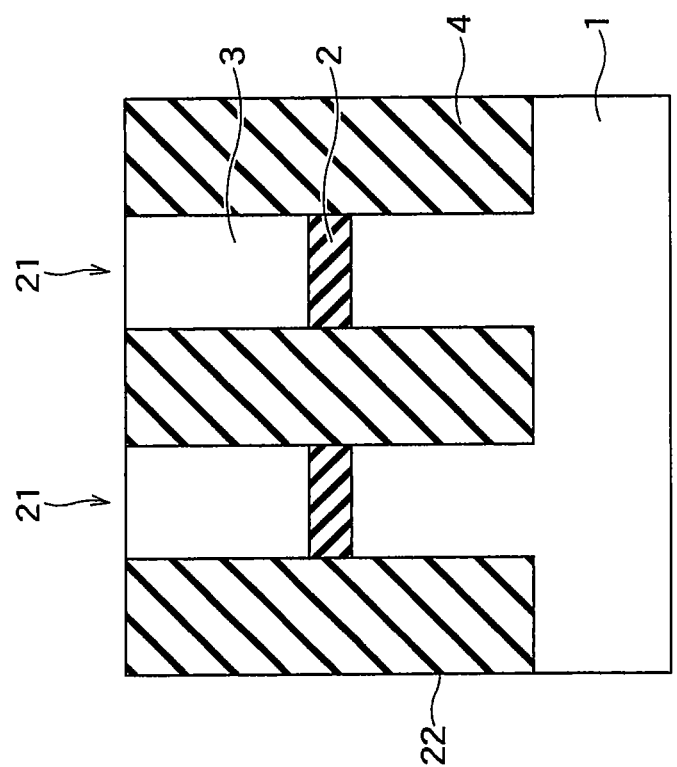

Next, as shown in FIG. 5B, the silicon oxide film 4 is etched back for about 10 to 20 nm, for example, by employing a wet etching method using a chemical liquid having etching selectivity between silicon and a silicon oxide film, a dry etching method, or the like. In the etch-back, as is understood from FIG. 3H, the silicon oxide film 4 is more deeply etched as compared to FIG. 3B of the first embodiment.

Figure 5D:
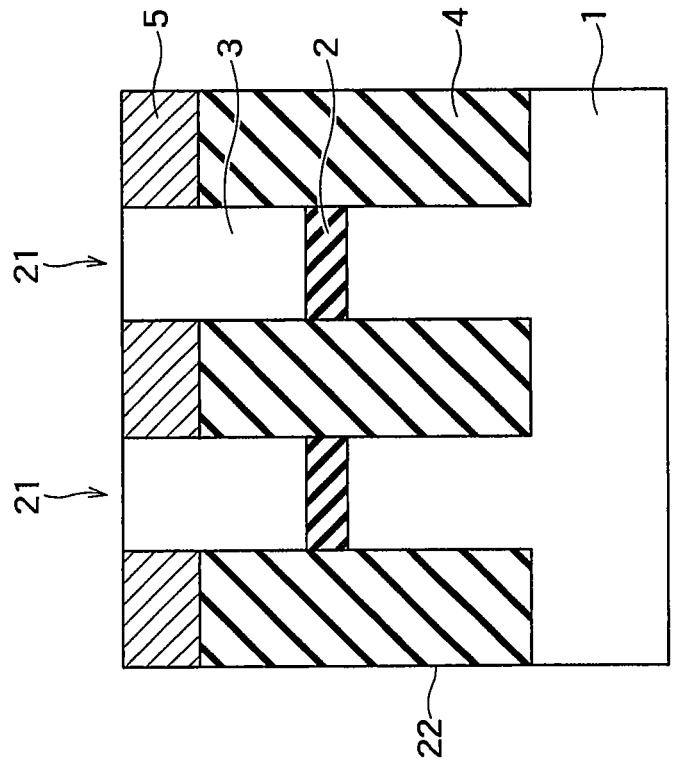
Figure 5C:
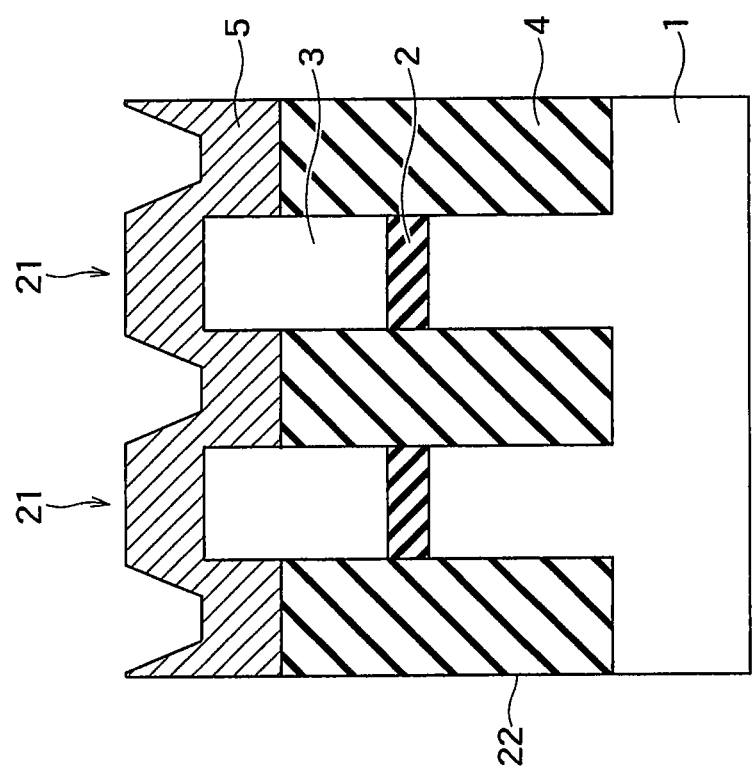

Next, as shown in FIG. 5C, the alumina film 5 having a film thickness of 10 nm, for example, is formed in such a manner as to cover the FG 3 and the silicon oxide film 4. As in the first embodiment, ALD, CVD, or PVD may be employed as the method for forming the alumina film 5. As is understood from FIG. 5C, the thickness of the alumina film 5 is increased in the present embodiment as compared to FIG. 3C of the first embodiment.

Next, as shown in FIG. 5D, the alumina film 5 is flattened by CMP by using the FG 3 as a stopper.

Figure 5F:
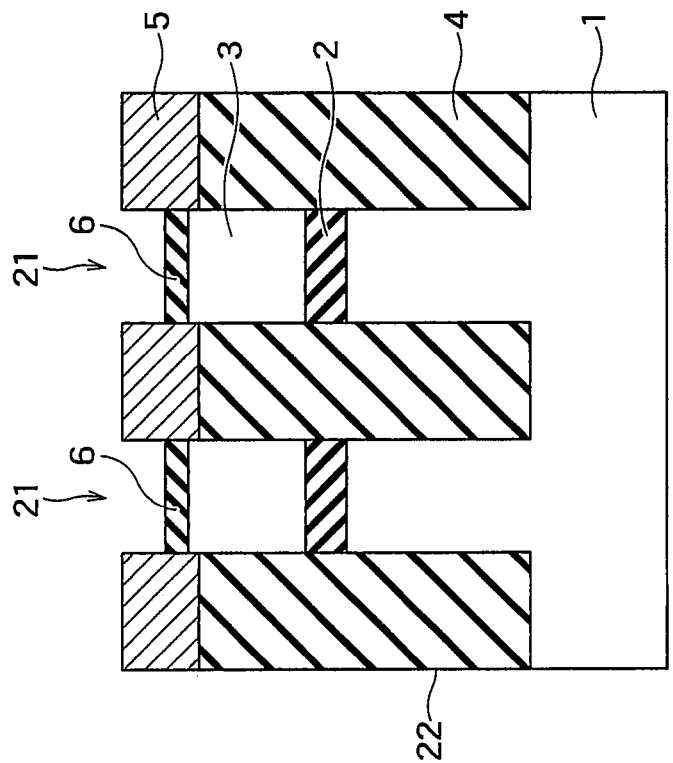
Figure 5E:
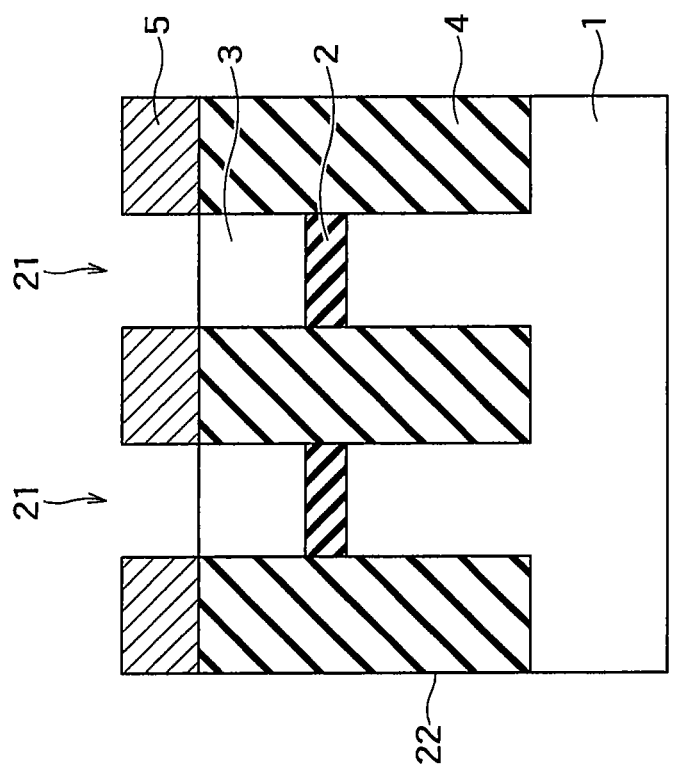

As shown in FIG. 5E, the FG 3 is etched back for about 10 nm, for example.

Next, as shown in FIG. 5F, an oxidation treatment is performed on a superficial portion of the FG 3, and a silicon oxide film 6 having a film thickness of 4 nm, for example, is formed on the superficial portion of the FG 3. In the present embodiment, the silicon oxide film 6 is to be mixed with a lanthanum aluminate film 7, and the silicon oxide film 6 is formed in such a manner that an upper surface of the silicon oxide film 6 formed on the FG 3 is lower than an upper surface of the alumina film 5 which suppresses a mixing reaction between the lanthanum aluminate film 7 and the silicon oxide film 6. With such structure, the alumina film 5 prevents lateral diffusion of silicon from the silicon oxide film 6, and, thus, the region of the lanthanum alumisilicate film 8 which is formed on the FG 3 is much more restricted on the FG 3.

Figure 5H:
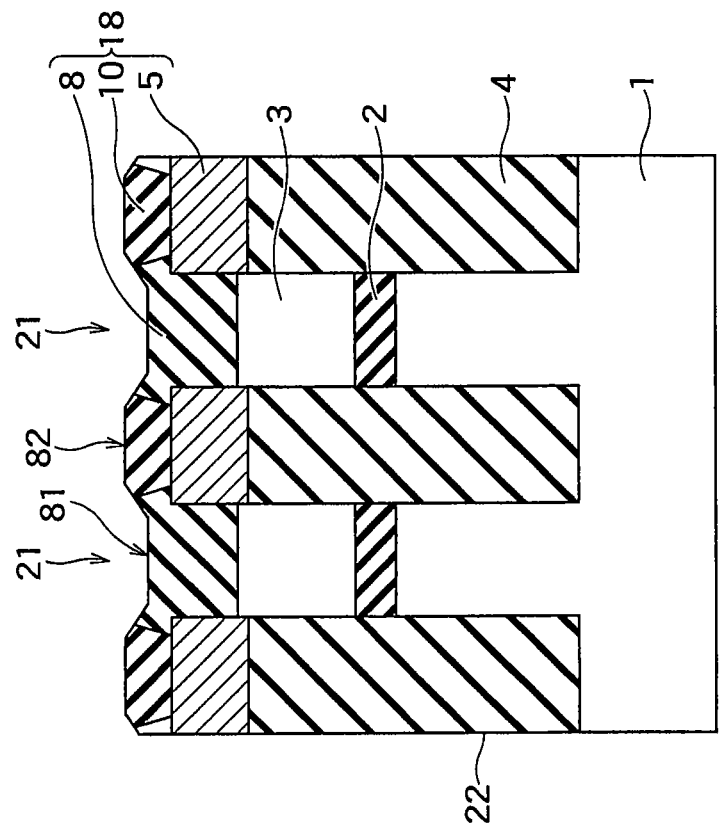
Figure 5G:
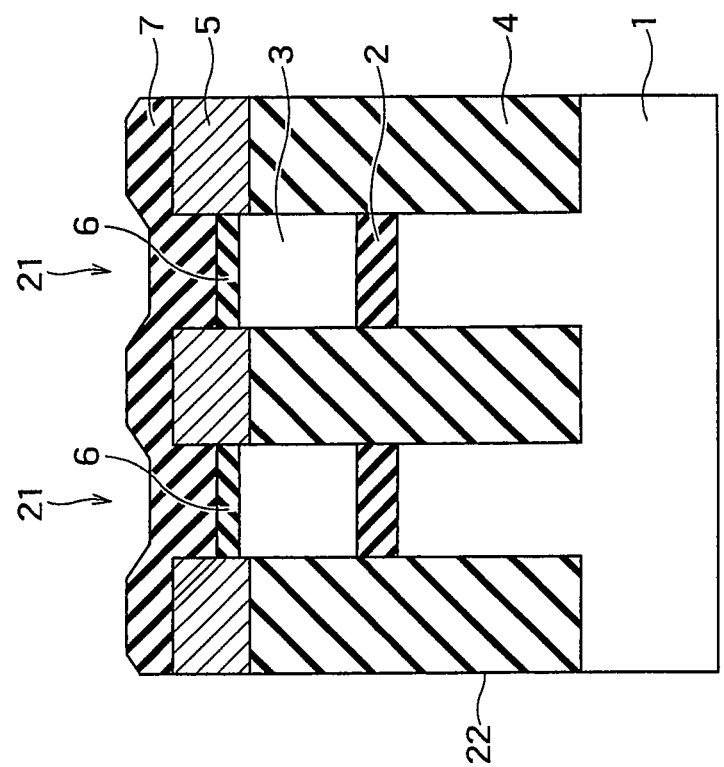
Figure 51:
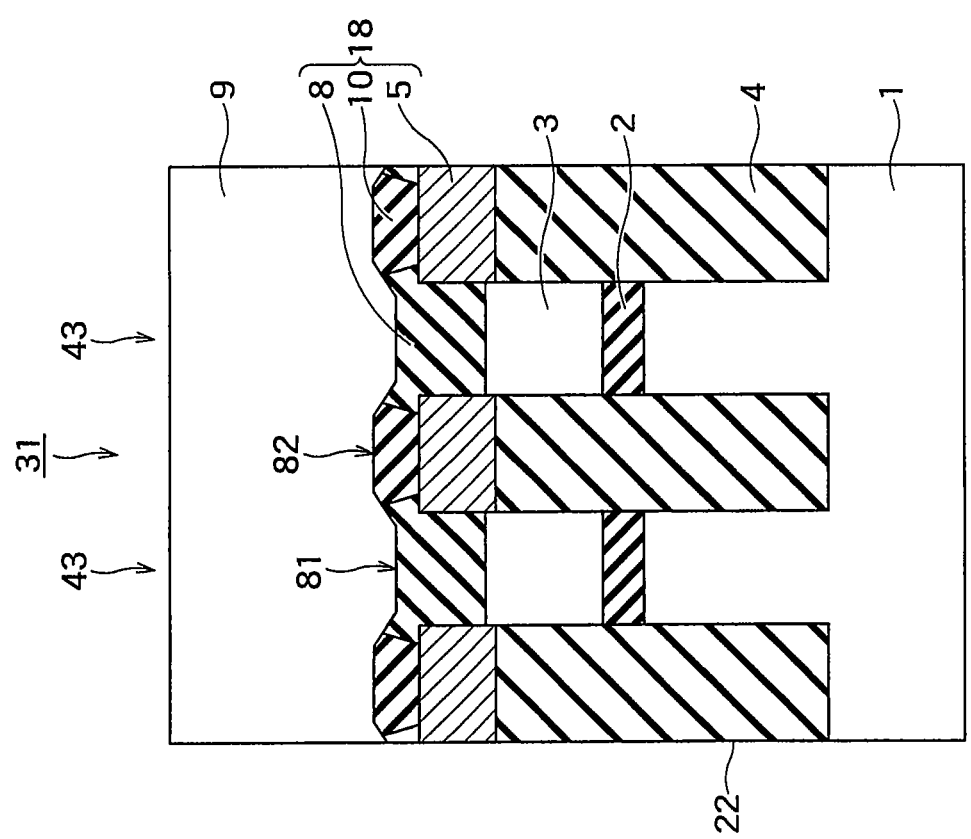

Next, as shown in FIG. 5G, the lanthanum aluminate film 7 having a film thickness of 8 nm, for example, is formed on the alumina film 5 and the silicon oxide film 6. As a method for forming the lanthanum aluminate film 7, CVD may be employed as in the first embodiment. Further, the lanthanum aluminate film 7 is formed so that the film thickness of the lanthanum aluminate film 7 in the present embodiment is larger than that of the silicon oxide film 6 in the first embodiment.

Next, the silicon oxide film 6 and the lanthanum aluminate film 7 are subjected to a heat treatment in a furnace at a temperature of 700° C. to 1100° C. under a nitrogen atmosphere to cause a mixing reaction therebetween. Thus, the lanthanum alumisilicate film 8 is formed on the FG 3 as shown in FIG. 5H.

Next, as shown in FIG. 5I, a control electrode film 9 is formed on the lanthanum aluminate film 7 and the lanthanum alumisilicate film 8. As described above, it is possible to obtain the semiconductor memory device 31.

Though the alumina film is exemplified as the lower insulating film 5 and the lanthanum alumisilicate film as the cell upper portion 81 in the present embodiment, other films may be used in the same manner as in the first embodiment.

According to the present embodiment, since it is possible to form the IPD insulating film 18 having low dielectric constant in such a manner as to be restricted on the memory cell 43, it is possible to much more reduce the dielectric constant of the IPD insulating film 18 on the cell. Therefore, since it is possible to form the high-k insulating film having less defect and better film quality in the cell upper portion 81 of the IPD insulating film 18 without changing the capacitance value of the entire IPD insulating film 18, it is possible to obtain the semiconductor memory device 31 which is excellent in electric characteristics and reliability.

Third Embodiment

Though the alumina film 5 which suppresses the mixing reaction between the lanthanum aluminate film 7 and the silicon oxide film 4 is formed in such a manner as to perfectly cover the silicon oxide film 4 in the first embodiment, an alumina film 5 in the present embodiment is formed in such a manner as to widely cover a lateral wall upper part of a FG 3. Since the lateral wall upper part of the FG 3 is widely covered with the film having high dielectric constant, it is possible to reduce a dielectric constant of an insulating film 8 forming a cell upper portion 81. Therefore, since it is possible to form a high-k insulating film having less defect and better film quality in the cell upper portion 81, it is possible to obtain a semiconductor memory device which is excellent in electric characteristics and reliability.

The semiconductor memory device 31 of the present embodiment will be described. A FG type semiconductor memory device 31 having a flat cell structure will be taken as an example in the following description, but the present invention is not limited to the semiconductor device 31 and is useful for semiconductor devices of other types.

As described in the foregoing, a plan view in a memory cell region of the nonvolatile semiconductor memory device 31 of the third embodiment is the same as that shown in FIG. 1. The description of FIG. 1 is not repeated.

By using FIG. 6(a) which is a sectional view taken along the line A-A' of FIG. 1, the semiconductor memory device 31 of the third embodiment will be described. A sectional view of the semiconductor memory device 31 of the present embodiment taken along the line B-B' of FIG. 1 is shown in FIG. 6(b). Since FIG. 6(b) is the same as FIG. 2(b) showing the sectional view corresponding to the first embodiment, the description for FIG. 6(b) is not given.

Figure 6:
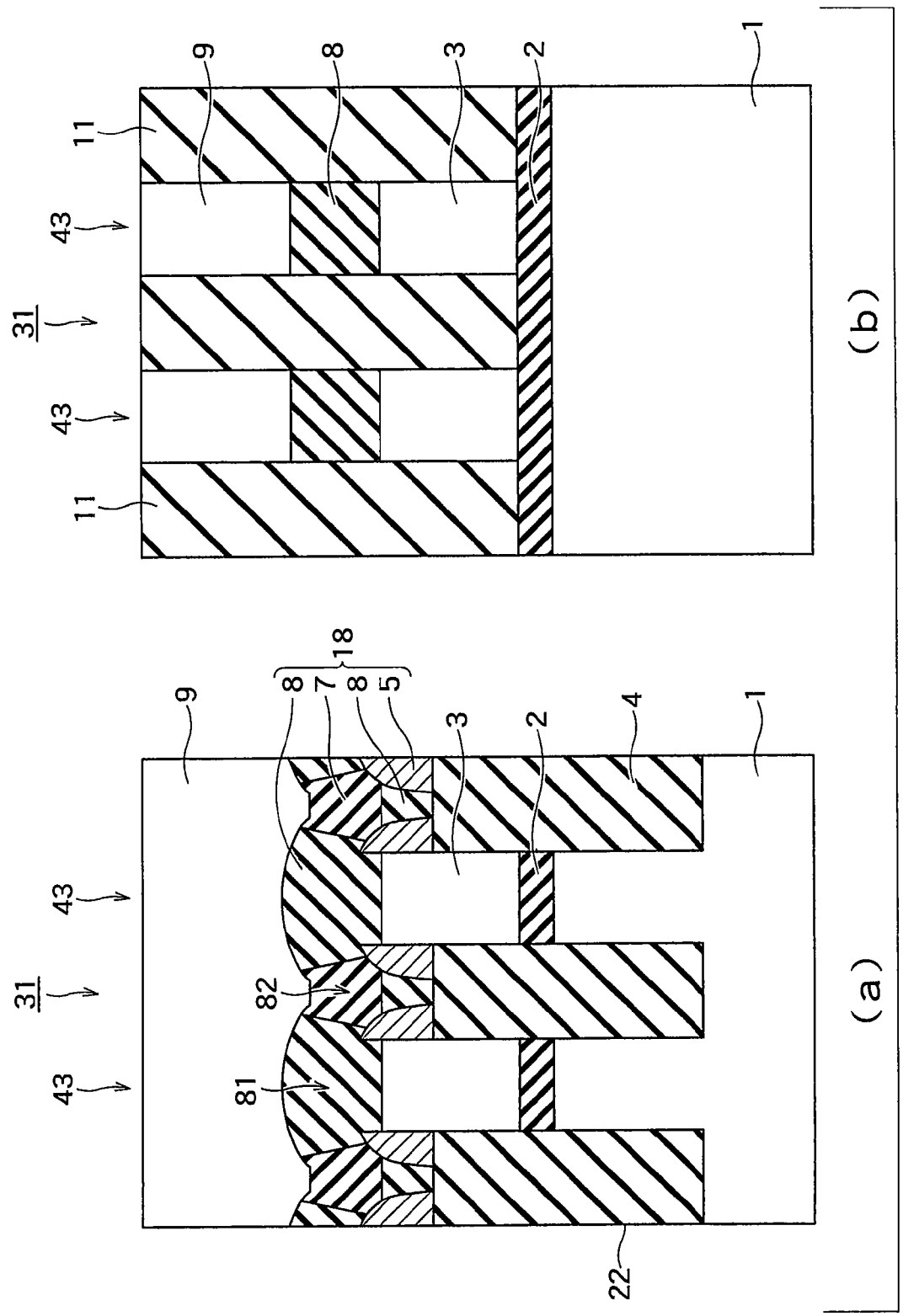
FIG. 6 is a sectional view schematically showing the semiconductor memory device according to the third embodiment.

As shown in FIG. 6(a), the semiconductor memory device 31 of the present embodiment has a semiconductor substrate 1 and a plurality of memory cells 43 formed on the semiconductor substrate 1. The memory cells 43 are separated from each other for a predetermined distance by an element isolation trench 22, and a silicon oxide film 4 is embedded in the element isolation trench 22. The semiconductor memory device 31 has an IPD insulating film 18 formed on the plurality of memory cells 43 and the silicon oxide film 4 and a control electrode film 9 formed on the IPD insulating film 18. Each of the memory cells 43 has a layer structure in which a tunnel insulating film 2 and a FG 3 are sequentially formed on the semiconductor substrate 1. An upper surface of the silicon oxide film 4 is lower than an upper surface of the FG 3, and a lateral wall portion (a side surface) which do not contact the silicon oxide film 4 among lateral walls of the FG 3 is covered with an alumina film (third insulating film) 5. The IPD insulating film 18 has a cell upper portion 81 on the FG 3 and an inter-cell portion 82 on the silicon oxide film 4, and a dielectric constant of the cell upper portion 81 is lower than a dielectric constant of the alumina film 5. The cell upper portion 81 is formed from a lanthanum-containing insulating film 8, more specifically, from a lanthanum alumisilicate film.

As compared to the first embodiment (see FIG. 2(a)), the alumina film 5 widely covers the lateral wall upper portion of the FG 3 in the third embodiment (see FIG. 6(a)).

Hereinafter, a method for producing the semiconductor memory device 31 according to the third embodiment will be described with reference to FIG. 7A to FIG. 7H. FIG. 7A to FIG. 7H are corresponding to the sectional view taken along the line A-A' of FIG. 1 and FIG. 6(a).

Figure 7A:
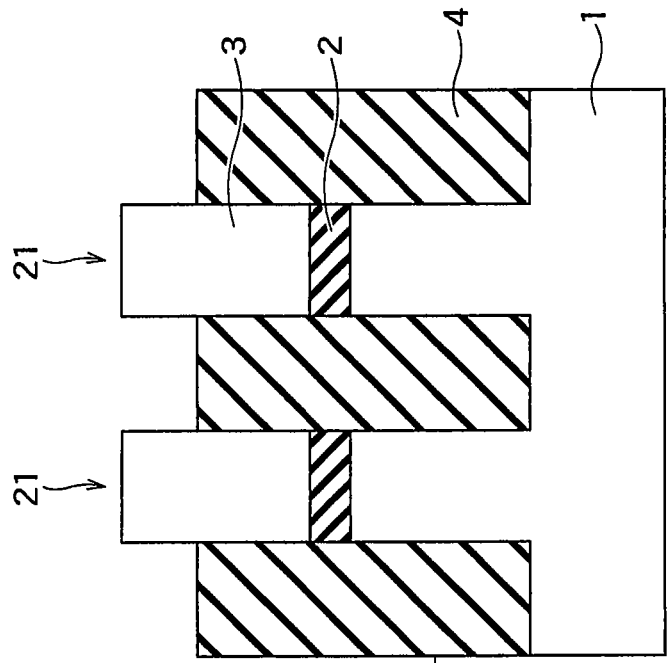

As shown in FIG. 7A, an element region 21 and the element isolation trench 22 are formed on the semiconductor substrate 1 as in the first embodiment. In the element region 21 in which the memory cell 43 is to be formed, the tunnel insulating film 2 is formed on the silicon substrate 1, and the FG 3 is formed on the tunnel insulating film 2. The silicon oxide film 4 is embedded in the element isolation trench 22, and upper surfaces of the element region 21 and the silicon oxide film 4 are flattened by CMP.

Figure 7B:
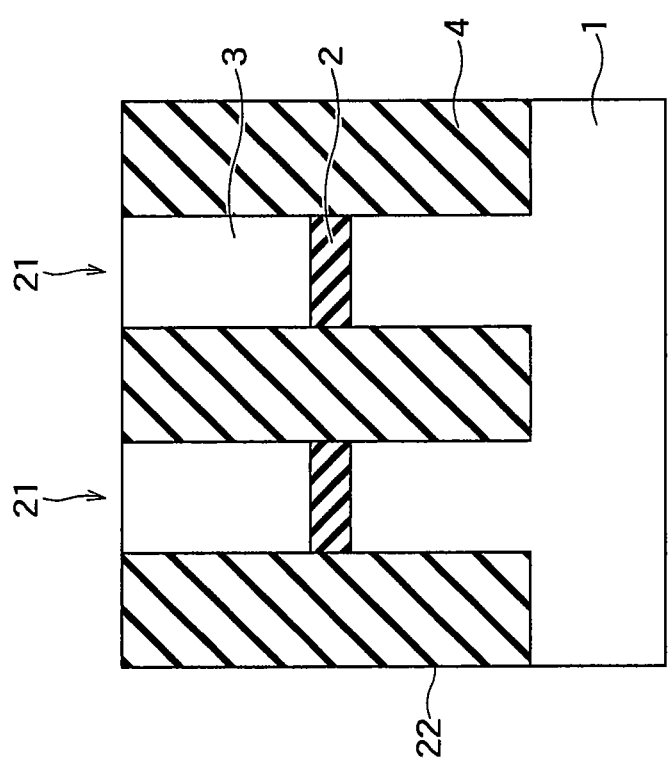

Next, as shown in FIG. 7B, the silicon oxide film 4 is etched back for about 10 to 20 nm, for example, by employing a wet etching method using a chemical liquid having etching selectivity between silicon and a silicon oxide film, a dry etching method, or the like. In the etch-back, as is understood from FIG. 7B, the silicon oxide film 4 is more deeply etched as compared to FIG. 3B of the first embodiment.

Next, as shown in FIG. 7C, the alumina film 5 having a film thickness of 5 nm, for example, is formed in such a manner as to cover the FG 3 and the silicon oxide film 4. As in the first embodiment, ALD, CVD, or PVD may be employed as the method for forming the alumina film 5. As is understood from FIG. 7C, the alumina film 5 in the present embodiment is formed so that the thickness of the alumina film 5 in the present embodiment is larger than that of the alumina film 5 in the first embodiment (see FIG. 3C).

Next, as shown in FIG. 7D, the alumina film 5 is etched in such a manner that the alumina film 5 remains only on the lateral wall of the FG 3, i.e. in such a manner that the alumina film 5 covers only the lateral walls of the FG 3. It is preferable to perform the etching so as not to expose the upper surface of the silicon oxide film 4 or so as to maintain an area to be exposed as small as possible.

Figure 7F:
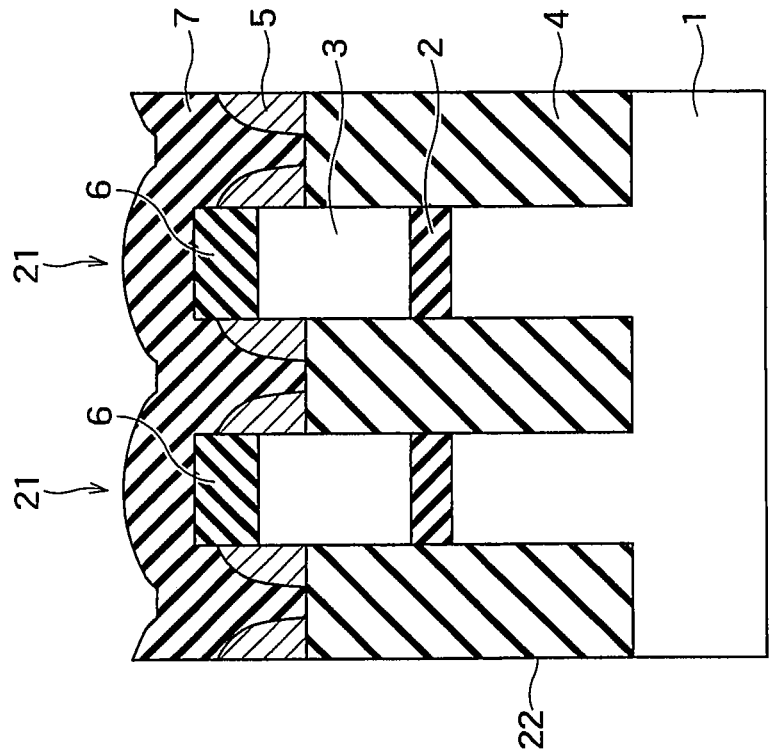
Figure 7E:
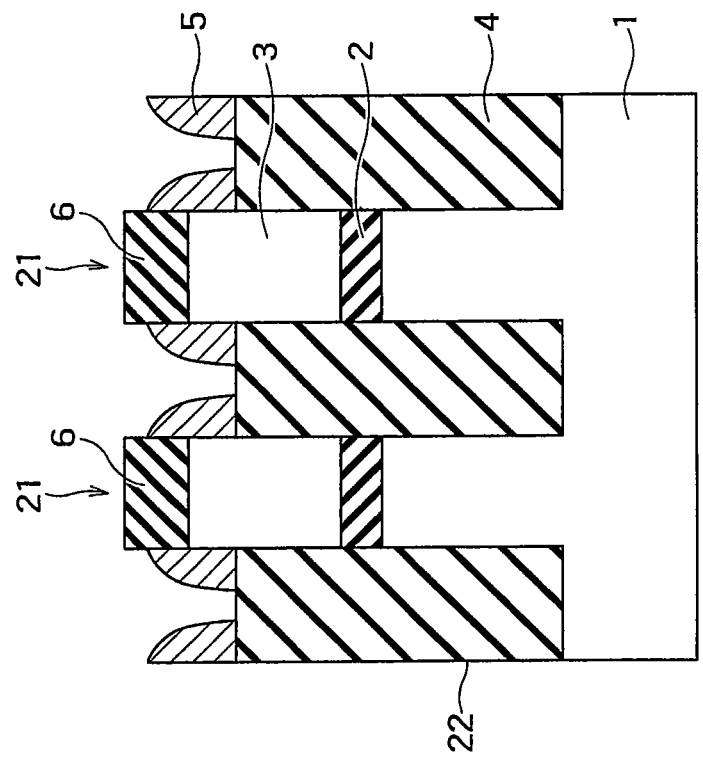

As shown in FIG. 7E, an oxidation treatment is performed on a superficial portion of the FG 3, and a silicon oxide film 6 having a film thickness of 8 nm, for example, is formed on the superficial portion of the FG 3.

Next, as shown in FIG. 7F, a lanthanum aluminate film 7 having a film thickness of 8 nm, for example, is formed on the alumina film 5 and the silicon oxide film 6. As a method for forming the lanthanum aluminate film 7, CVD may be employed as in the first embodiment.

Next, the silicon oxide film 6 and the lanthanum aluminate film 7 are subjected to a heat treatment in a furnace at a temperature of 700° C. to 1100° C. under a nitrogen atmosphere to cause a mixing reaction therebetween. Thus, the lanthanum alumisilicate film 8 is formed on the FG 3 as shown in FIG. 7G. Similarly, the silicon oxide film 4 and the lanthanum aluminate film 7 cause a mixing reaction so that the lanthanum alumisilicate film 8 is formed on the silicon oxide film 4 as shown in FIG. 7G. It is noted that unreacted lanthanum aluminate film 7 remains on the silicon oxide film 4.

Next, as shown in FIG. 7H, a control electrode film 9 is formed on the lanthanum aluminate film 7 and the lanthanum alumisilicate film 8. As described above, it is possible to obtain the semiconductor memory device 31.

In the present embodiment, the alumina film is exemplified as the film 5 which covers the lateral wall upper portion of the FG 3, and the lanthanum alumisilicate film is exemplified as the cell upper portion 81. However, other films may be used in the same manner as in the first embodiment. More specifically, as the film 5 which covers the lateral wall upper portion of the FG 3, an insulating nitride film such as a silicon nitride film, an aluminum nitride film, and a boron nitride film as well as an oxide film containing a non-transition metal such as a magnesium oxide film may be used. Further, as the cell upper portion 81, a yttrium silicate film, a hafnium silicate film, a zirconium silicate film, a yttrium alumisilicate film, a hafnium alumisilicate film, a zirconium alumisilicate film, or a lanthanum hafnium silicate film may be used. In this case, in place of the lanthanum aluminate film 7 which is the material film of the cell upper portion 81, any one of a yttrium oxide film, a hafnium oxide film, a zirconium oxide film, a lanthanum oxide film, a yttrium aluminate film, a hafnium aluminate film, a zirconium aluminate film, a lanthanum hafnium oxide film, a hafnium silicate film, and a lanthanum silicate film is used.

According to the present embodiment, since it is possible to widely cover the lateral wall upper portion of the FG 3 with the high dielectric constant film, it is possible to much more reduce the dielectric constant of the insulating film 8 forming the cell upper portion 81. Therefore, since it is possible to form the high-k insulating film having less defect and better film quality in the cell upper portion 81 of the IPD insulating film 18 without changing the capacitance value of the entire IPD insulating film 18, it is possible to obtain the semiconductor memory device 31 which is excellent in electric characteristics and reliability. Further, according to the present embodiment, since the flattening of the alumina film 5 by CMP and the etch-back of the FG 3 are not performed, formation of the insulating film structure is easily controlled, and it is possible to reduce the production time and cost.

In the foregoing embodiments, the semiconductor substrate 1 is not necessarily the silicon substrate, and other substrates (e.g. SOI (silicon on insulator) or SiGe substrate) may be used. Further, those in which a semiconductor structure or the like is formed on the various substrates may be used.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A nonvolatile semiconductor memory device comprising:
   a semiconductor substrate;
   an element isolation insulating film buried in the semiconductor substrate so as to isolate adjacent element;
   a memory cell having a layered structure in which a first insulating film and a charge accumulation film are sequentially layered on the semiconductor substrate;
   a second insulating film formed on the charge accumulation film and the element isolation insulating film; and
   a control electrode film formed on the second insulating film,
   wherein
   an upper surface of the element isolation insulating film is lower than an upper surface of the charge accumulation film; and
   the second insulating film includes a cell upper portion and an inter-cell portion, the cell upper portion being above the charge accumulation film, the inter-cell portion being above the element isolation insulating film, in which a dielectric constant of the cell upper portion is lower than a dielectric constant of the inter-cell portion.

2. The nonvolatile semiconductor memory device according to claim 1, wherein the inter-cell portion comprises a lower insulating film formed on the element isolation insulating film, and an upper insulating film formed on the lower insulating film.

3. The nonvolatile semiconductor memory device according to claim 2, wherein the lower insulating film is formed from an insulating film selected from an alumina film, a silicon nitride film, an aluminum nitride film, a boron nitride film, and a magnesium oxide film.

4. The nonvolatile semiconductor memory device according to claim 2, wherein the lower insulating film is formed in such a manner as to cover an entire part of the upper surface of the element isolation insulating film.

5. The nonvolatile semiconductor memory device according to claim 1, wherein the cell upper portion is formed from an insulating film including at least one element selected from lanthanum, yttrium, hafnium, and zirconium.

6. The nonvolatile semiconductor memory device according to claim 1, wherein the cell upper portion is formed from an insulating film selected from a lanthanum alumisilicate film, a yttrium silicate film, a hafnium silicate film, a zirconium silicate film, a yttrium alumisilicate film, a hafnium alumisilicate film, a zirconium alumisilicate film, and a lanthanum hafnium silicate film.

* * * * *